United States Patent
Gorin

[11] Patent Number: 6,112,696
[45] Date of Patent: Sep. 5, 2000

[54] DOWNSTREAM PLASMA USING OXYGEN GAS MIXTURE

[75] Inventor: Georges J. Gorin, San Rafael, Calif.

[73] Assignee: Dry Plasma Systems, Inc., San Rafael, Calif.

[21] Appl. No.: 09/024,286

[22] Filed: Feb. 17, 1998

[51] Int. Cl.[7] .............................. C23C 16/00; B44C 1/22; B05D 3/14
[52] U.S. Cl. .............................. 118/723 IR; 118/723 ER; 216/68; 438/711; 438/714; 438/729; 427/562
[58] Field of Search ..................... 427/562–564, 427/574–579; 216/67–70; 438/711–714, 729; 118/723 IR

[56] References Cited

U.S. PATENT DOCUMENTS

| | | | |
|---|---|---|---|
| 4,664,747 | 5/1987 | Sakiguchi et al. | 156/643 |
| 5,018,479 | 5/1991 | Markunas et al. | 118/723 |
| 5,180,435 | 1/1993 | Markunas et al. | 118/723 |
| 5,226,056 | 7/1993 | Kikuchi et al. | 373/18 |
| 5,620,523 | 4/1997 | Maeda et al. | 118/723 IR |
| 5,641,359 | 6/1997 | Yavelberg | 118/723 R |
| 5,753,320 | 5/1998 | Mikoshiba et al. | 427/572 |
| 5,904,952 | 5/1999 | Lopata et al. | 427/8 |

*Primary Examiner*—Maria Nuzzolillo
*Assistant Examiner*—Tracy Dove
*Attorney, Agent, or Firm*—Paul F. Wille

[57] ABSTRACT

A constriction in the exhaust side of a discharge chamber containing oxygen isolates the oxygen supply from the rest of the system. A constriction of equal size or larger is used in the supply of another gas, thereby enabling mixtures of oxygen and other gases to be used in a downstream plasma system. In one embodiment of the invention, the gases are dissociated separately and then combined in a mixing chamber. In another embodiment, oxygen is dissociated and then a lighter gas is added and the mixture is dissociated. In a preferred embodiment of the invention, the lighter gas is selected from the group consisting of water vapor and nitrogen.

5 Claims, 1 Drawing Sheet

DOWNSTREAM PLASMA USING OXYGEN GAS MIXTURE

BACKGROUND OF THE INVENTION

This invention relates to treating a semiconductor wafer with a plasma or a glow discharge for dissociating a gas into reactive ionic and neutral species and, in particular, to a downstream etch using gas mixtures containing oxygen.

Plasma etch apparatus can be divided into two broad categories, downstream or remote etching and direct etching. In downstream etching, the semiconductor wafer is not immersed in the glow discharge, as it is in direct etching. The result is a somewhat more gentle treatment of the wafer because high frequency at high power is not coupled through the wafer. In either type of apparatus, it is known in the art to employ an oxygen bearing plasma for removing organic compounds such as photoresist or for oxidizing a semiconductor wafer.

More typically, oxygen is used in combination with other gases due to the highly reactive nature of oxygen. It is known in the art to add nitrogen or water vapor to oxygen in a downstream plasma cleaning chamber. A problem with these additives is that the energy necessary to dissociate a nitrogen molecule or a water molecule is much less than that necessary to dissociate an oxygen molecule. In the discharge zone, the applied energy is absorbed mostly by the water vapor or the nitrogen.

In the prior art, a power supply producing 1500 watts of microwave power was necessary to assure dissociation of the gas mixture. Much of this power is wasted in recombination away from the wafer. Often the reactive ions attack the chamber, or other components, thereby introducing undesirable contamination into the process.

A problem with either nitrogen or water vapor is that the molecules diffuse everywhere, including toward the source of oxygen, thereby contaminating the source. While one could adjust the relative flows of the gases, the mixture would be determined by the diffusion problem rather than by the most effective mixture for cleaning or oxidizing a wafer.

In view of the foregoing, it is therefore an object of the invention to provide apparatus for efficiently dissociating oxygen and an additive gas in a plasma.

Another object of the invention is to provide apparatus for producing reactive ionic and neutral species from a mixture of oxygen and an additive gas, without contaminating the source of oxygen.

A further object of the invention is to provide apparatus for producing an effective amount of reactive ion species and neutral species from a mixture of oxygen and an additive gas at an applied power as low as 50 watts.

SUMMARY OF THE INVENTION

The foregoing objects are achieved in this invention in which it has been found that a constriction in exhaust side of the discharge chamber containing oxygen localizes the oxygen plasma to the region of the constriction and isolates the oxygen plasma from the rest of the system. The constriction is smaller than or the same size as the lines supplying other gases and, at a pressure of 1–3 Torr, a constriction having an inside diameter of four mm. or less effectively isolates the source of oxygen from the rest of the system, thereby enabling mixtures of oxygen and lighter gases to be used in a downstream plasma system.

In one embodiment of the invention, the gases are dissociated separately and then combined in a mixing chamber. In another embodiment, oxygen is dissociated and then a lighter gas is added and the mixture is dissociated. In a preferred embodiment of the invention, the lighter gas is selected from the group consisting of water vapor and nitrogen.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
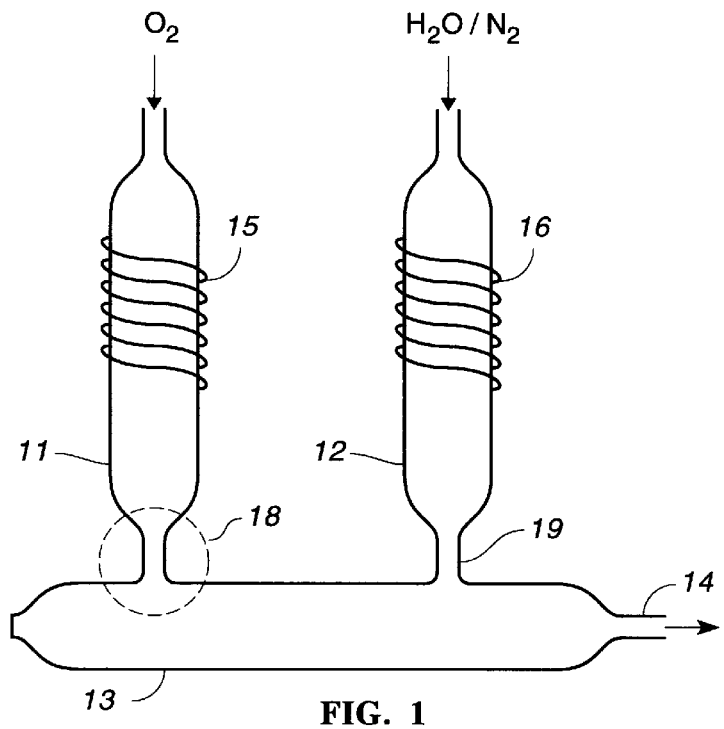
FIG. 1 illustrates plasma generating apparatus constructed in accordance with the invention.

In FIG. 1, discharge chamber 11 and discharge chamber 12 are coupled to mixing chamber 13 for combining the gases from the chambers and supplying the mixture to output port 14. Inductor 15 surrounds discharge chamber 11 and dissociates the gas passing through the chamber. Similarly, inductor 16 surrounding discharge chamber 12 dissociates the gas passing through the chamber. Discharge chamber 11 is coupled to mixing chamber 13 by constriction 18 and discharge chamber 12 is coupled to the mixing chamber by constriction 19. In accordance with one aspect of the invention, constriction 18 has an inside diameter of 4 mm. or less and constriction 19 has an inside diameter that is larger than or equal to the inside diameter of constriction 18.

In operation, oxygen is supplied to discharge chamber 11 from a suitable source (not shown) and discharge chamber 12 is supplied with either water vapor or nitrogen from a suitable source (not shown). The flow of gases is controlled to maintain the pressure of 1–3 Torr in mixing chamber 13. A total flow of 300 SCCM yielded a pressure of 1 Torr and a total flow of 900 SCCM yielded a pressure of 3 Torr. The composition of the mixture was changed while keeping the total flow a constant. A mixture of 50–90 percent oxygen was found effective.

Figure 4:
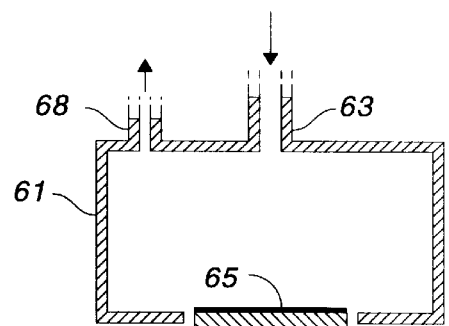
FIG. 4 is a schematic cross-section of downstream plasma etch equipment.

Radio frequency (RF) power is coupled to the discharge chambers by inductors 15 and 16. It has been found that an applied power of as little as 50 watts per discharge chamber is sufficient to dissociate the gases. The gases dissociate, forming reactive ionic species and neutral species, and flow through constrictions 18 and 19 into mixing chamber 13 where they mix and pass through output port 14 to a treatment chamber, such as shown in FIG. 4.

The length of the tubing or piping between chambers does not appear to be critical but it is preferred that the tubing be as short as possible. A length of six millimeters is preferred. A longer tube has a noticeable pressure drop that increases the pressure within a discharge chamber upstream of the tube.

Figure 2:
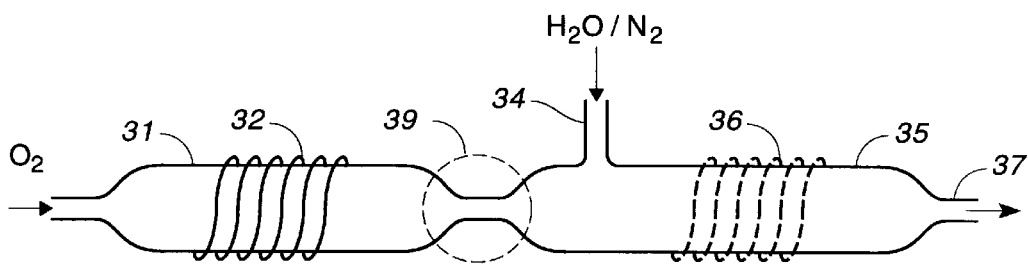
FIG. 2 illustrates plasma generating apparatus constructed in accordance with an alternative embodiment the invention.

FIG. 1 illustrates an embodiment of the invention in which, in a sense, the discharge chambers are operating parallel. FIG. 2 illustrates an alternative embodiment of the invention in which the discharge chambers operate in series. Oxygen is supplied to discharge chamber 31 and dissociated by RF power coupled through inductor 32. A lighter gas is supplied through port 34 to discharge chamber 35 where it is dissociated by the RF power from inductor 36. The power applied to each of inductors 32 and 36 is approximately 50 watts.

In accordance with an alternative embodiment of the invention, inductor 36 is eliminated and the power applied to inductor 32 is increased to 100–150 watts. When using a single inductor, the energy supplied to the oxygen is coupled by the oxygen to the lighter gas, dissociating the lighter gas in discharge chamber 35. The gases mix and are withdrawn through output port 37 to a treatment chamber (not shown in FIG. 2).

In the embodiment illustrated in FIG. 2, the pressures and flows are approximately the same as those given for the embodiment of FIG. 1. Discharge chamber 31 is coupled to discharge chamber 35 by constriction 39. In accordance with the invention, it is preferred that constriction 39 have an inside diameter of four millimeters or less and that the inside diameter of output port 37 be larger than or equal to the inside diameter of constriction 39. The invention was implemented using glass tubing having an inside diameter of about nineteen millimeters and it appears that the plasma is most active at the constriction rather than being centered within the inductors.

The location of the most active portion of the plasma provides a visual check for assuring proper operation of the apparatus. If the invention were implemented with tubing having an inside diameter larger or smaller than nineteen millimeters, the location of the most active region can be used to determine the optimum size of the constriction in the oxygen supply. If the plasma appears most active within the discharge chamber rather than near the constriction, the constriction on the discharge chamber is too large. For the particular tubing and pressures used, a constriction of 2.75 mm. in the oxygen supply is preferred.

Figure 3:
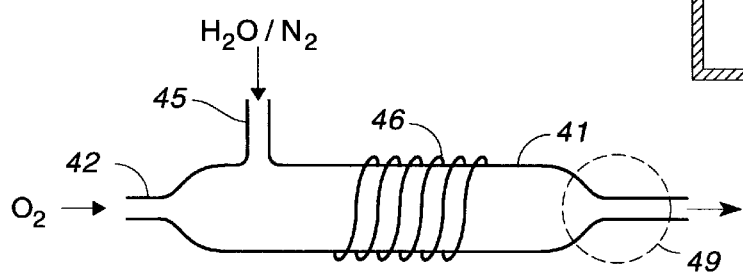
FIG. 3 illustrates plasma generating apparatus constructed in accordance with an alternative embodiment the invention.

FIG. 3 illustrates an alternative embodiment of the invention in which oxygen and the secondary or lighter gas are supplied to a single discharge chamber. In FIG. 3, oxygen is supplied to discharge chamber 41 through input port 42. Water vapor or nitrogen is supplied to discharge chamber 41 through input port 45. RF power is coupled to within the discharge chamber by inductor 46 and an applied power of approximately 150 watts is used. The output from chamber 41 includes constriction 49 and the mixed, dissociated gases are withdrawn from discharge chamber 41 through the constriction. Constriction 49 has an inside diameter of four millimeters or less, preferably 2.75 mm., when operating at a pressure of 1–3 Torr.

FIG. 4 is a schematic cross-section of a chamber for treating semiconductor wafers. Chamber 61 includes one or more supply ports, such as port 63, for receiving mixed, dissociated gases and distributing them uniformly over semiconductor wafer 65 on platen 66. Gases are removed from chamber 61 by a suitable vacuum pump (not shown) through one or more exhaust ports, represented by exhaust port 68.

The invention thus provides apparatus for efficiently dissociating oxygen and an additive gas in a plasma to provide reactive ionic and neutral species from a mixture of oxygen and an additive gas, without contaminating the source of oxygen. An effective amount of reactive ion species is obtained from a mixture of oxygen and an additive gas at an applied power as low as 50 watts.

Having thus described the invention, it will be apparent to those of skill in the art that various modifications can be made within the scope of the invention. For example, RF power can be capacitively coupled, rather than inductively coupled, to the discharge chamber. Although described in conjunction with the treatment of semiconductor wafers, other articles can be treated as well. For example, one can clean plastic parts or metallic parts in an oxygen plasma without exposing the parts to the plasma discharge zone.

What is claimed is:

1. A method for treating articles with a mixture of oxygen and a gas more easily dissociated than oxygen in a downstream plasma, said method comprising the steps of:

supplying oxygen to a first chamber;

applying RF power to dissociate the oxygen and create a plasma;

withdrawing the dissociated oxygen from the first chamber through a constriction, wherein the constriction is sized to locate the plasma near the constriction;

mixing the dissociated oxygen with another gas in a second chamber to form a mixture;

dissociating the mixture; and supplying the dissociated mixture to a third chamber containing the article.

2. The method as set forth in claim 1 wherein said mixture is dissociated by the energy in the dissociated oxygen.

3. The method as set forth in claim 1 wherein the step of dissociating the mixture includes the step of applying RF power to the mixture.

4. The method as set forth in claim 1 and further including the step of:

applying RF power to the gas in a fourth chamber to dissociate the gas prior to mixing the gas with the dissociated oxygen in the second chamber.

5. A method for treating articles with a mixture of oxygen and a gas more easily dissociated than oxygen in a downstream plasma, said method comprising the steps of:

supplying oxygen and the gas to a first chamber to form a mixture;

applying RF power to dissociate the mixture and create a plasma;

withdrawing the mixture from the first chamber through a constriction while maintaining the plasma near the constriction; and supplying the mixture to a second chamber containing the article.

* * * * *